(12) United States Patent
Lee et al.

(10) Patent No.: US 9,831,185 B2
(45) Date of Patent: Nov. 28, 2017

(54) CHIP PACKAGE AND FABRICATION METHOD THEREOF

(71) Applicant: XINTEC INC., Taoyuan (TW)

(72) Inventors: Shih-Yi Lee, Taoyuan (TW); Ying-Nan Wen, Hsinchu (TW); Chien-Hung Liu, New Taipei (TW); Ho-Yin Yiu, Hsinchu (TW)

(73) Assignee: XINTEC INC., Taoyuan (TW)

( * ) Notice: Subject to any disclaimer, the term of this patent is extended or adjusted under 35 U.S.C. 154(b) by 4 days.

(21) Appl. No.: 15/139,276

(22) Filed: Apr. 26, 2016

(65) Prior Publication Data

US 2016/0322305 A1    Nov. 3, 2016

Related U.S. Application Data

(60) Provisional application No. 62/153,987, filed on Apr. 28, 2015.

(51) Int. Cl.

| | |
|---|---|
| H01L 23/48 | (2006.01) |
| H01L 23/538 | (2006.01) |
| H01L 21/78 | (2006.01) |
| H01L 21/683 | (2006.01) |
| H01L 23/14 | (2006.01) |
| H01L 21/48 | (2006.01) |
| H01L 21/768 | (2006.01) |
| H01L 23/498 | (2006.01) |

(52) U.S. Cl.
CPC ........ H01L 23/5389 (2013.01); H01L 21/486 (2013.01); H01L 21/6835 (2013.01); H01L 21/76898 (2013.01); H01L 21/78 (2013.01); H01L 23/145 (2013.01); H01L 23/481 (2013.01); H01L 23/49827 (2013.01); H01L 23/49816 (2013.01); H01L 2221/68327 (2013.01); H01L 2224/13024 (2013.01); H01L 2224/18 (2013.01)

(58) Field of Classification Search
CPC ............. H01L 23/5389; H01L 21/4853; H01L 21/4857

See application file for complete search history.

(56) References Cited

U.S. PATENT DOCUMENTS

2009/0050996 A1*  2/2009 Liu ..................... H01L 23/3114
                                                       257/434

FOREIGN PATENT DOCUMENTS

| TW | 201513297 | 4/2015 |
| TW | 201515074 | 4/2015 |

* cited by examiner

*Primary Examiner* — Elias M Ullah

(74) *Attorney, Agent, or Firm* — Liu & Liu

(57) ABSTRACT

A chip package includes a chip, a laser stop layer, a first through hole, an isolation layer, a second through hole and a conductive layer. The laser stop layer is disposed above a first surface of the chip, and the first through hole is extended from a second surface to the first surface of the chip to expose the laser stop layer. The isolation layer is below the second surface and in the first through hole, and the isolation layer has a third surface opposite to the second surface. The second through hole is extended from the third surface to the first surface, and the second through hole is through the first through hole to expose the laser stop layer. The conductive layer is disposed below the third surface and extended into the second through hole to contact the laser stop layer.

20 Claims, 12 Drawing Sheets

CHIP PACKAGE AND FABRICATION METHOD THEREOF

RELATED APPLICATIONS

This application claims priority to U.S. provisional Application Ser. No. 62/153,987, filed Apr. 28, 2015, which is herein incorporated by reference.

BACKGROUND

Field of Invention

The present invention relates to a chip package and fabrication method thereof.

Description of Related Art

The finger print sensor and the RF (radio frequency) sensor require the use of a flat sensing surface to detect a signal, and the detecting accuracy of these sensing devices is reduced if the sensing surface is not flat. For example, a finger is pressed against the sensing surface of the finger print sensor. If the sensing surface is not flat, it will be difficult to detect complete fingerprint.

In addition, a through silicon via (TSV) is formed in a wafer to expose a pad from the TSV in the fabrication of the above sensing devices. Then, a chemical vapor deposition (CVD) process is applied to form a isolation layer on the pad and on the sidewalls of the TSV. After that, a patterning process is applied to form an opening in the isolation layer to expose the pad. Generally, the patterning process includes exposing, developing and etching processes. In the subsequent process, a redistribution layer is formed on the isolation layer and electrically connected to the pad exposed by the opening of the isolation layer.

However, the CVD and patterning processes are required to spend a lot process time and machine costs.

SUMMARY

The present disclosure provides a chip package including a chip, a laser stop layer, a first through hole, an isolation layer, a second through hole and a conductive layer. The chip has a conductive pad, a first surface and a second surface opposite to the first surface, and the conductive pad is below the first surface. The laser stop layer is disposed above the first surface and covering the conductive pad, and the first through hole is extended from the second surface to the first surface to expose the laser stop layer. The isolation layer is disposed below the second surface and in the first through hole, and the isolation layer has a third surface opposite to the second surface. The second through hole is extended from the third surface to the first surface, and the second through hole is through the first through hole to expose the laser stop layer. The conductive layer is disposed below the third surface and extended into the second through hole to contact the laser stop layer.

In various embodiments of the present disclosure, the chip package further includes a passivation layer and an external conductive connection. The passivation layer is below the third surface and the conductive layer, and the passivation layer has an opening exposing the conductive layer. The external conductive connection is in the opening and in contact with the conductive layer.

In various embodiments of the present disclosure, a hole diameter of the second through hole is less than a hole diameter of the first through hole.

In various embodiments of the present disclosure, the conductive layer includes a seed layer and a metal layer.

In various embodiments of the present disclosure, a sidewall and a bottom of the second through hole are rough surfaces.

In various embodiments of the present disclosure, the laser stop layer includes copper.

In various embodiments of the present disclosure, the laser stop layer has a thickness in a range from about 3 micrometers to 20 micrometers.

In various embodiments of the present disclosure, the isolation layer includes epoxy.

In various embodiments of the present disclosure, a thickness of the conductive layer below the third surface of the isolation layer is greater than a thickness of the conductive layer on a sidewall of the second through hole.

In various embodiments of the present disclosure, a thickness of the conductive layer on a sidewall of the second through hole is greater than a thickness of the conductive layer below the laser stop layer.

The present disclosure provides a method of fabricating a chip package, and the method includes following steps. A wafer is provided having a conductive pad, a first surface and a second surface opposite to the first surface, which the conductive pad is below the first surface. A laser stop layer is formed above the first surface to cover the conductive pad, and a support body is formed above the first surface to cover the laser stop layer. A first through hole is formed to extend from the second surface to the first surface to expose the laser stop layer, and an isolation layer is formed below the second surface to fill the first through hole, which the isolation layer has a third surface opposite to the second surface. A laser is used to remove a portion of the isolation layer to form a second through hole, and the laser is through the first through hole and stopped at the laser stop layer. A conductive layer is formed below the third surface and below the laser stop layer exposed from the second through hole.

In various embodiments of the present disclosure, the method further includes following steps. A passivation layer is formed below the third surface of the isolation layer and below the conductive layer, and the passivation layer is patterned to form an opening exposing the conductive layer.

In various embodiments of the present disclosure, the method further includes forming an external conductive connection in the opening, and the external conductive connection is in contact with the conductive layer.

In various embodiments of the present disclosure, the method further includes following steps. The support body is removed, and the wafer, the isolation layer and the passivation layer are diced along a scribe line to form the chip package.

In various embodiments of the present disclosure, the laser is aligned to the first through hole when using the laser to remove the portion of the first isolation layer.

In various embodiments of the present disclosure, forming the conductive layer includes following steps. A seed layer is formed below the third surface and in the second through hole, and a metal layer is formed below the seed layer.

In various embodiments of the present disclosure, the laser stop layer is formed by electroplating.

In various embodiments of the present disclosure, the isolation layer is formed by printing or coating.

In various embodiments of the present disclosure, the method further includes polishing the second surface of the wafer after forming the support body above the first surface.

In various embodiments of the present disclosure, the method further includes coating, imprinting, molding or polishing the third surface of the isolation layer after forming the isolation layer below the second surface and filling the first through hole.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
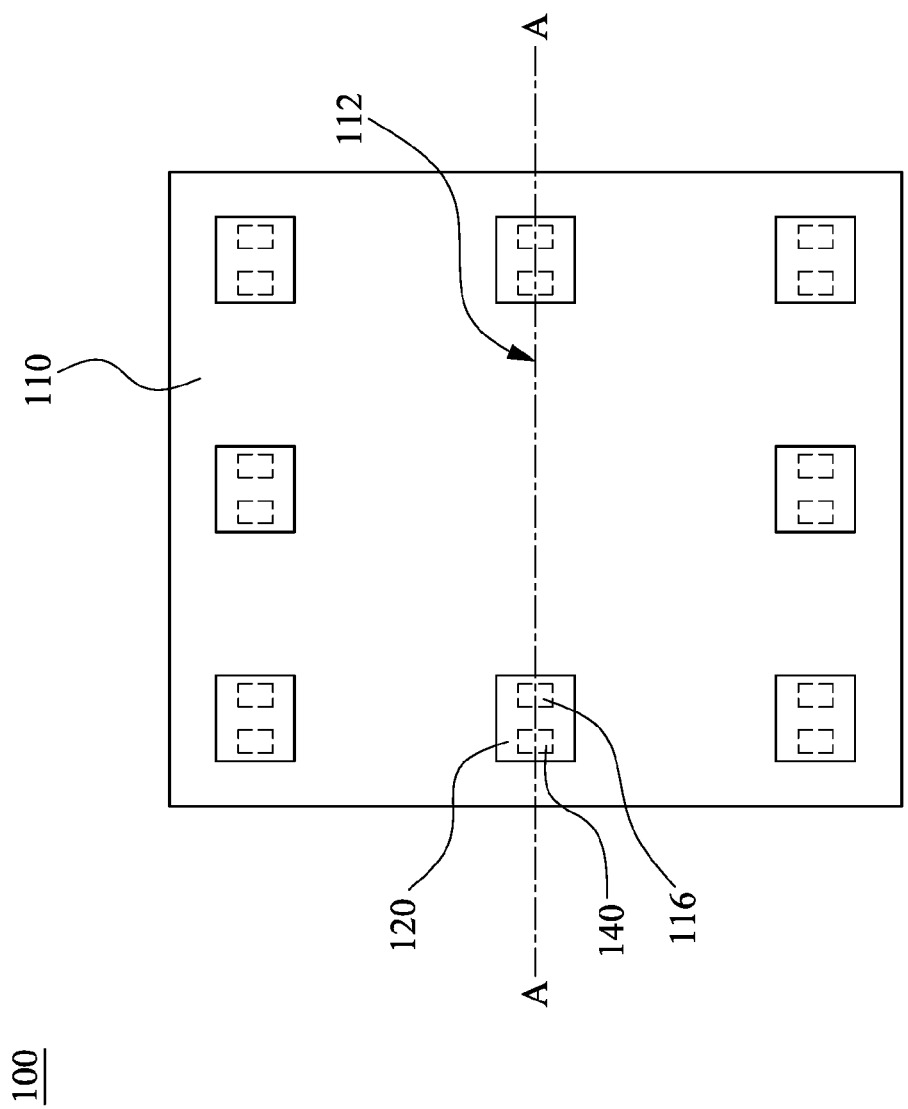
FIG. 1 illustrates a top view of a chip package according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
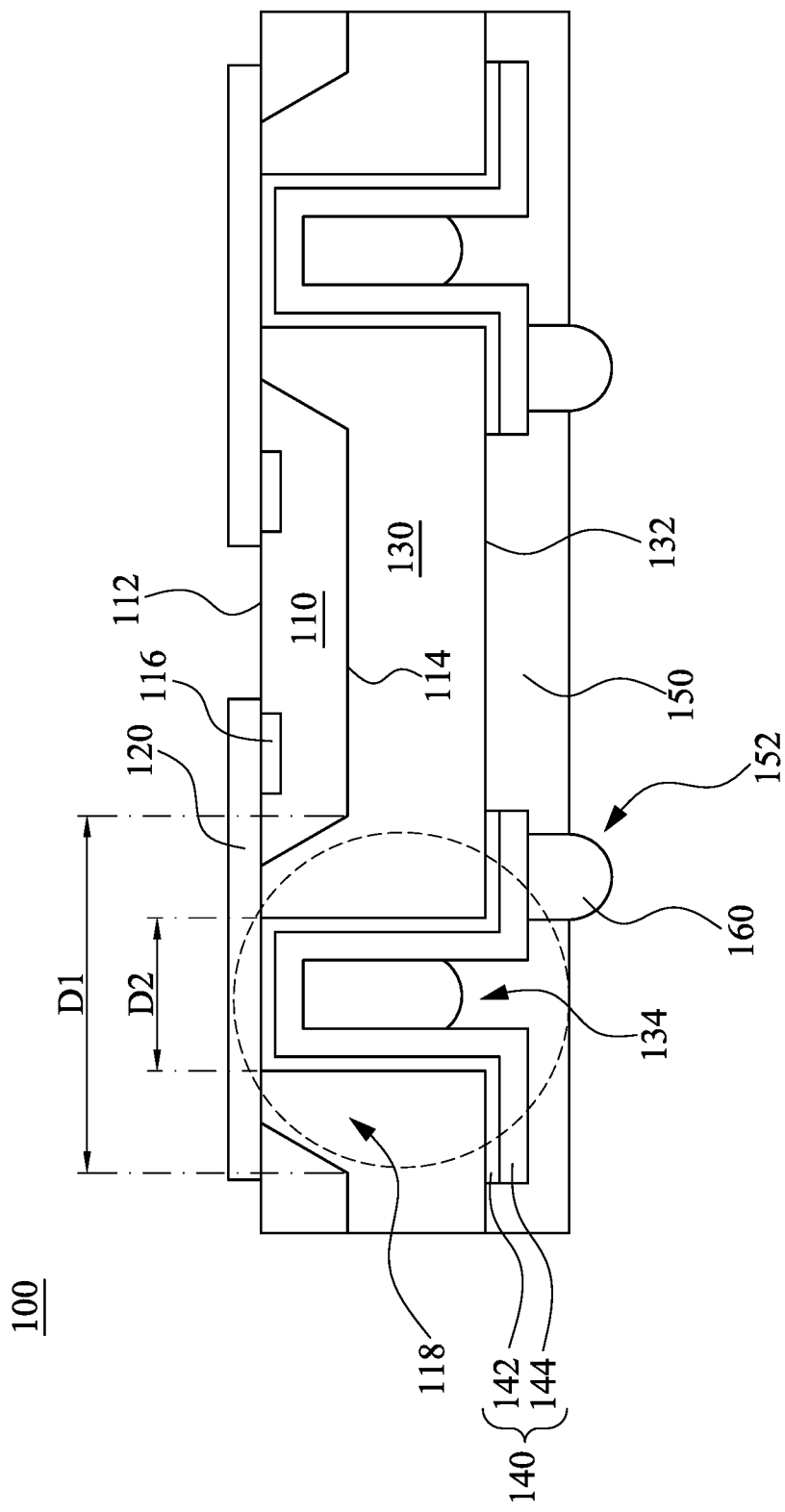
FIG. 2 illustrates a cross-sectional view of the chip package in FIG. 1 along the line A-A.

FIG. 1 illustrates a top view of a chip package according to various embodiments of the present disclosure, and FIG. 2 illustrates a cross-sectional view of the chip package in FIG. 1 along the line A-A. Refer to FIG. 1 and FIG. 2 at the same time. A chip package 100 includes a chip 110, a laser stop layer 120, a isolation layer 130, a conductive layer 140, a passivation layer 150 and an external conductive connection 160. The chip 110 is a sensor chip having a first surface 112 and a second surface 114 opposite to the first surface 112, which the first surface 112 acts as a sensing surface. In some embodiments, the chip 110 is formed of silicon, germanium or group III-V compounds, but not limited thereto. A conductive pad 116 is below the first surface 112 of the chip 110, and the laser stop layer 120 is above the first surface 112 and covering the conductive pad 116. In addition, the second surface 114 of the chip 110 has a first through hole 118 extending from the second surface 114 to the first surface 112 to expose the laser stop layer 120.

Continuing in FIG. 1 and FIG. 2, the isolation layer 130 is below the second surface 114 and in the first through hole 118 to cover the laser stop layer 120 exposed from the first through hole 118, which the isolation layer 130 includes epoxy. The isolation layer 130 has a third surface 132 opposite to the second surface 114. A second through hole 134 is extended from the third surface 132 to the first surface 112, and the second through hole 134 is through the first through hole 118 to expose the laser stop layer 120, which the second through hole 134 is a laser through hole. Specifically, a laser is applied for penetrating the isolation layer 130 below the second surface 114 and the isolation layer 130 in the first through hole 118, so as to form the second through hole 134, and the laser stop layer 120 acts as a terminal of the laser. By applying the laser, a hole diameter D2 of the second through hole 134 is less than the hole diameter D1 of the first through hole 118, and it is benefit for miniaturization design.

In some embodiments, the material of the laser stop layer 120 is selected from a conductive material able to block the laser, such as copper. In addition, the laser stop layer 120 has a sufficient thickness to block the laser. In various embodiments, a thickness T2 of the laser stop layer 120 above the first surface 112 is between 3 and 20 micrometers.

Continuing in FIG. 1 and FIG. 2, the conductive layer 140 is below the third surface 132 of the isolation layer 130, and a portion of the conductive layer 140 is in the second through hole 134 to contact the laser stop layer 120, which is exposed from the second through hole 134. In some embodiments, the conductive layer 140 includes a seed layer 142 and a metal layer 144 below the seed layer 142, and the metal layer 144 is greater than seed layer in thickness. In various embodiments, the seed layer 142 and the metal layer 144 includes copper. The passivation layer 150 is below the third surface 132 of the isolation layer 130 and below the conductive layer 140, and the passivation layer 150 has an opening 152 exposing the conductive layer 140. In addition, the external conductive connection 160 is in the opening 152 and in contact with the conductive layer 140. The external conductive connection 160 is electrically connected to the conductive pad 116 via the conductive layer 140 and the laser stop layer 120.

In some embodiments, the external conductive connection 160 includes a solder ball, a bump or other well-known structures in the industry, and a shape of the external conductive connection 160 includes spherical, oval, square or rectangular, but not limited thereto.

In some embodiments, the chip package 100 is a finger print sensor or a RF sensor, but not limited thereto.

Figure 3:
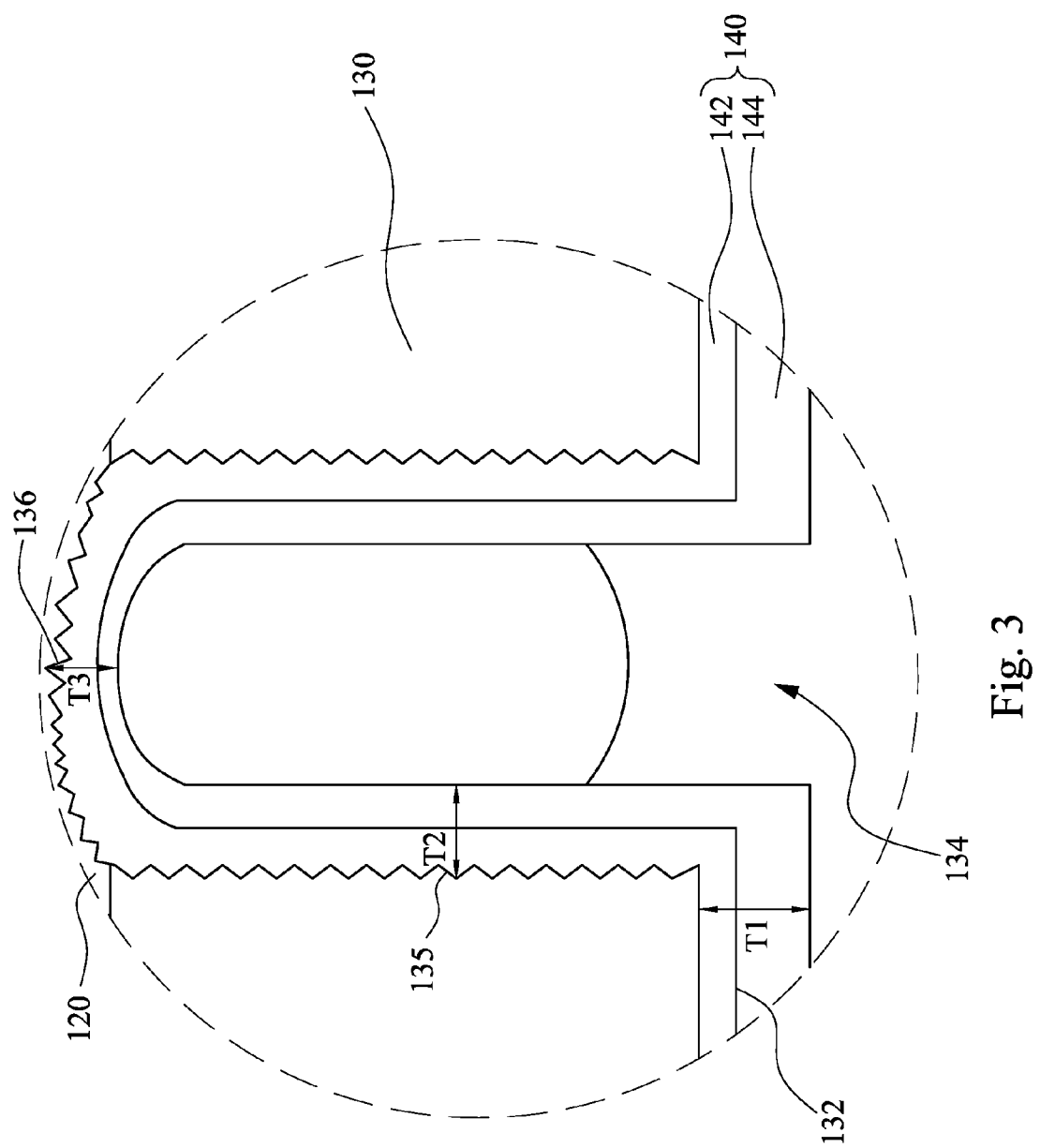
FIG. 3 illustrates an enlarge view of a portion of the chip package 100 in FIG. 2.

FIG. 3 illustrates an enlarge view of a portion of the chip package 100 in FIG. 2. As shown in FIG. 3, the laser is applied to form the second through hole 134, and the laser stop layer 120 acts as the terminal of the laser. Even though a portion of the laser stop layer 120 is removed by the laser, but the laser is not able to penetrate the laser stop layer 120. In addition, sidewalls 135 and a bottom 136 of the second through hole 134 are rough surfaces since the second through hole 134 is formed by the laser, and the laser stop layer 120 is exposed at the bottom 136 of the second through hole 134.

After forming the second through hole 134, the conductive layer 140 is formed below the third surface 132 of the isolation layer 130. The conductive layer 140 is further extended to cover the sidewalls 135 and the bottom 136 of the second through hole 134, so as the conductive layer 140 is electrically connected to the laser stop layer 120. As aforementioned, the conductive layer 140 includes a seed layer 142 and a metal layer 144, for example, the seed layer 142 is formed by a physical vapor deposition method, and then the metal layer 144 is formed by electroplating. The conductive layer 140 has a thickness T1 below the third surface 132 of the isolation layer 130, a thickness T2 on the sidewalls 135 of the second through hole 134, and a thickness T3 below the bottom 136 of the second through hole 134. The thickness T1 is greater than thickness T2, and the thickness T2 is greater than thickness T3, since the metal layer 144 is formed by electroplating.

Figure 4:
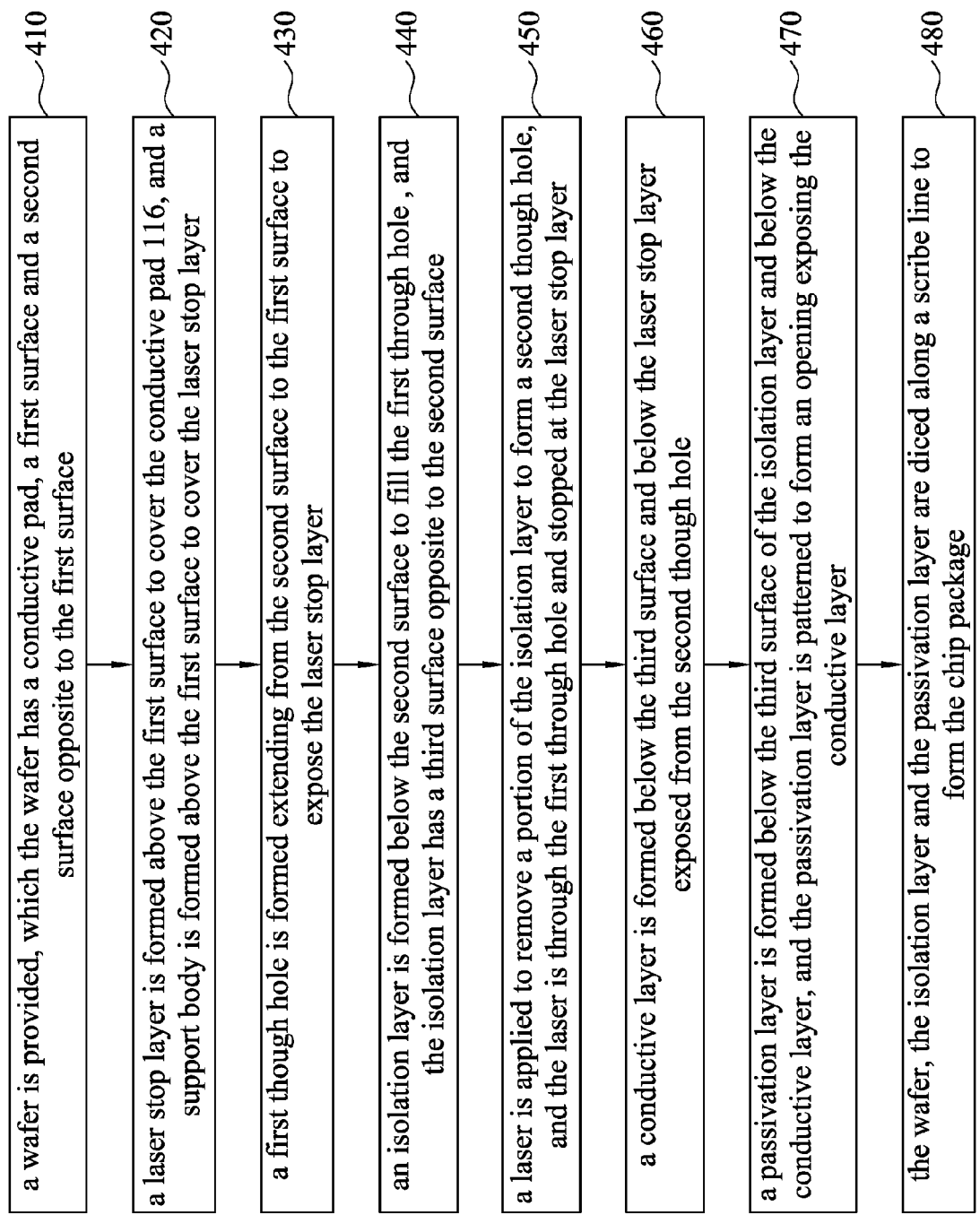
FIG. 4 illustrates a flow chart of a method of fabricating the chip package, in accordance with various embodiments.

Referring to FIG. 4, FIG. 4 illustrates a flow chart of a method of fabricating the chip package, in accordance with various embodiments. Refer to FIGS. 5A to 5H at the same time to further understand the method of fabricating the chip package, which FIGS. 5A to 5H are cross-sectional views of the chip package in FIG. 2 at intermediate stages of fabrication, in accordance with various embodiments.

Figure 5A:
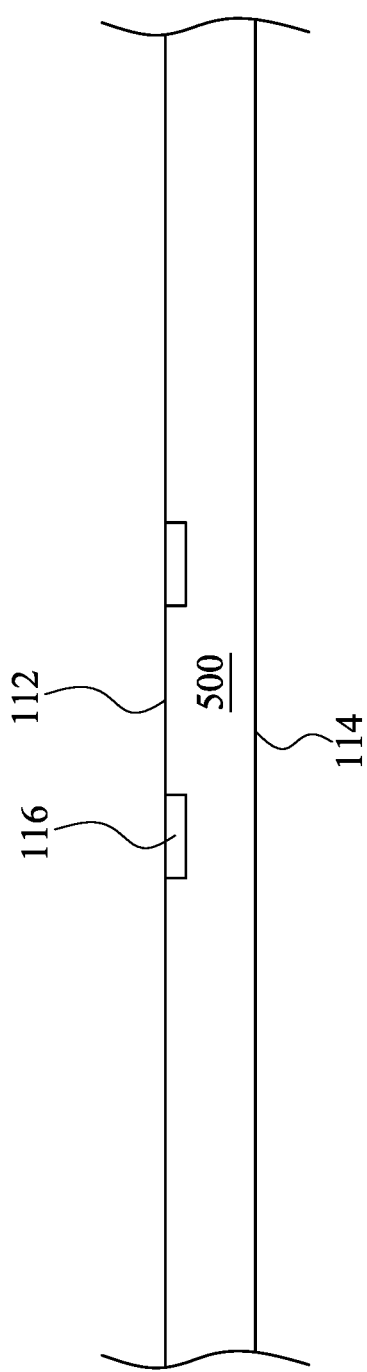
FIGS. 5A to 5H are cross-sectional views of the chip package in FIG. 2 at intermediate stages of fabrication, in accordance with various embodiments.

Refer to step 410 and FIG. 5A, a wafer 500 is provided, which the wafer 500 has a conductive pad 116, a first surface 112 and a second surface 114 opposite to the first surface 112. The conductive pad 116 is below the first surface 112. The wafer 500 is a semiconductor substrate, which a plurality of chips shown in FIG. 2 are formed by dicing the wafer 500.

Figure 5B:
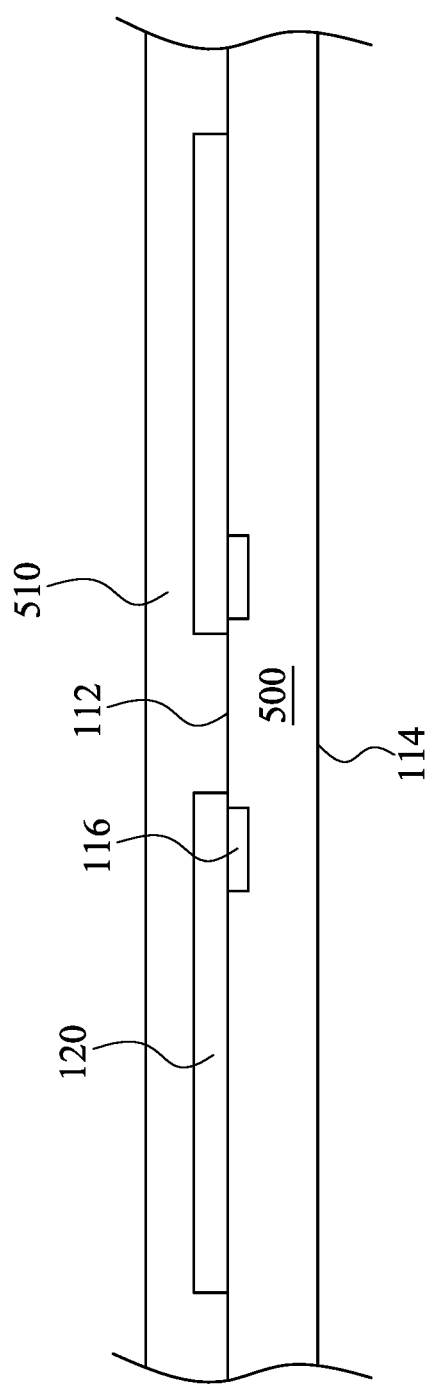

Refer now to step 420 and FIG. 5B, a laser stop layer 120 is formed above the first surface 112 to cover the conductive pad 116, and a support body 510 is formed above the first surface 112 to cover the laser stop layer 120. In this step, the laser stop layer 120 is formed by sputtering, evaporating, electroplating or electroless plating. In some embodiment, the laser stop layer 120 includes copper or other suitable materials, but not limited thereto. The support body 510 provides support force in the subsequent process to prevent external force cracking the wafer 500. In some embodiments, the second surface 114 of the wafer 500 is further polished after bonding the wafer 500 and the support body 510, so as to reduce a thickness of the wafer 500.

Figure 5C:
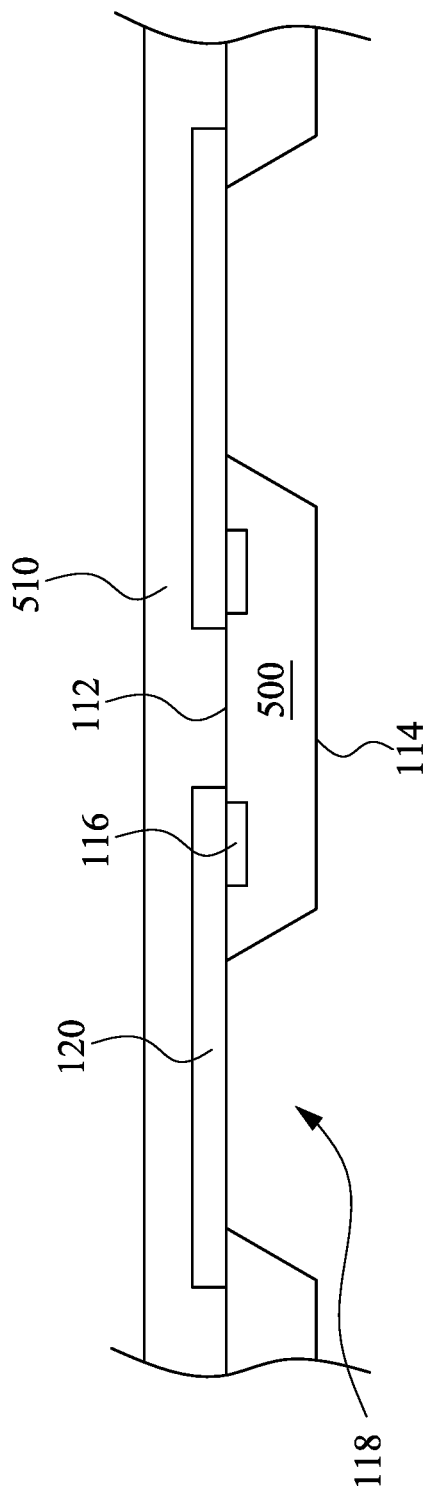

Continuing in step 430 and FIG. 5C, a first through hole 118 is formed extending from the second surface 114 to the first surface 112 to expose the laser stop layer 120. The first through hole 118 may be formed by, for example, photolithography etching, but not limited thereto.

Figure 5D:
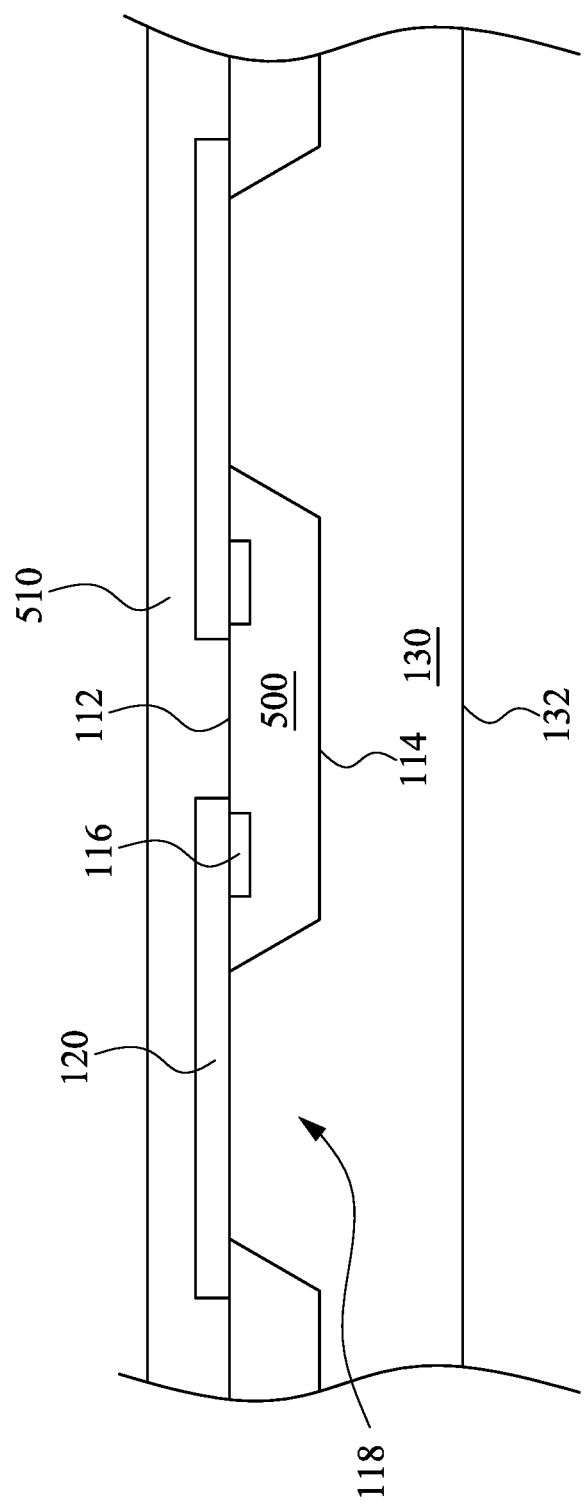

Continuing in step 440 and FIG. 5D, an isolation layer 130 is formed below the second surface 114 to fill the first through hole 118, and the isolation layer 130 has a third surface 132 opposite to the second surface 114. In this step, an epoxy material is printed or coated on the second surface 114 of the wafer 500, and portion of the first isolation layer 130 flows into the first through hole 118 to fully fill the first through hole 118. In some embodiments, the third surface 132 of the isolation layer 130 is further coated, imprinted, molded or polished to reduce a thickness of the isolation layer 130.

Figure 5E:
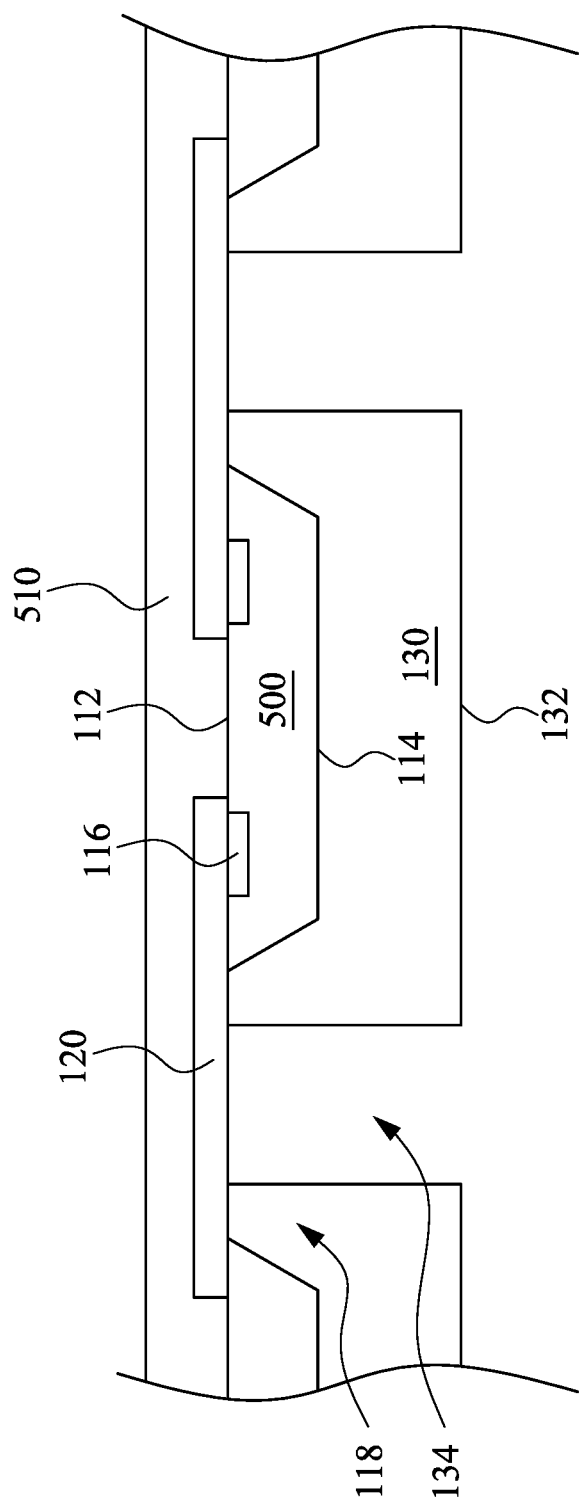

Continuing in step 450 and FIG. 5E, a laser is applied to remove a portion of the isolation layer 130 to form a second through hole 134, and the laser is through the first through hole 118 and stopped at the laser stop layer 120. In this step, the emitting laser is aligned to the first through hole 118, which the laser penetrates the isolation layer 130 below the second surface and the isolation layer 130 in the first through hole 118. However, the laser is not able to penetrate the laser stop layer 120, which acts as a terminal of the laser and being exposed from the second through hole 134. The second through hole 134 is through the first through hole 118 since the laser is aligned to the first through hole 118. Described in different ways, the second through hole 134 is surrounded by the first through hole 118.

Figure 5F:
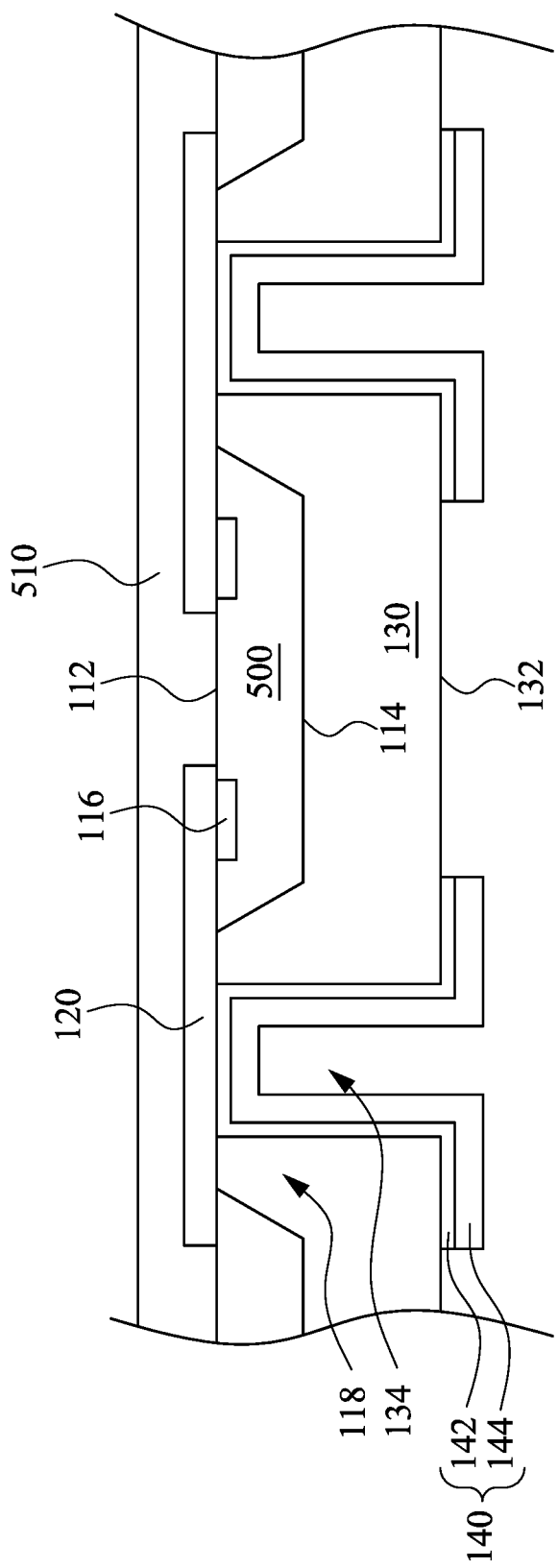

Continuing in step 460 and FIG. 5F, a conductive layer 140 is formed below the third surface 132 and below the laser stop layer 120 exposed from the second through hole 134. After forming the second through hole 134, a seed layer 142 is physical vapor deposited to cover the third surface 132 of the isolation layer 130, the sidewalls of the second through hole 134, and the laser stop layer 120 exposed from the second through hole 134. second surface 114 and on the conductive pad 116 exposed from the first through hole 118. Then, the metal layer 144 is formed below the seed layer 142 by using electroless plating method and electroplating method. The seed layer 142 not only provides conducting function, but also acts as a nucleation layer to induce the formation of the subsequent metal layer 144 during the electroplating method. In some embodiments, the seed layer 142 and the metal layer include copper.

Figure 5G:
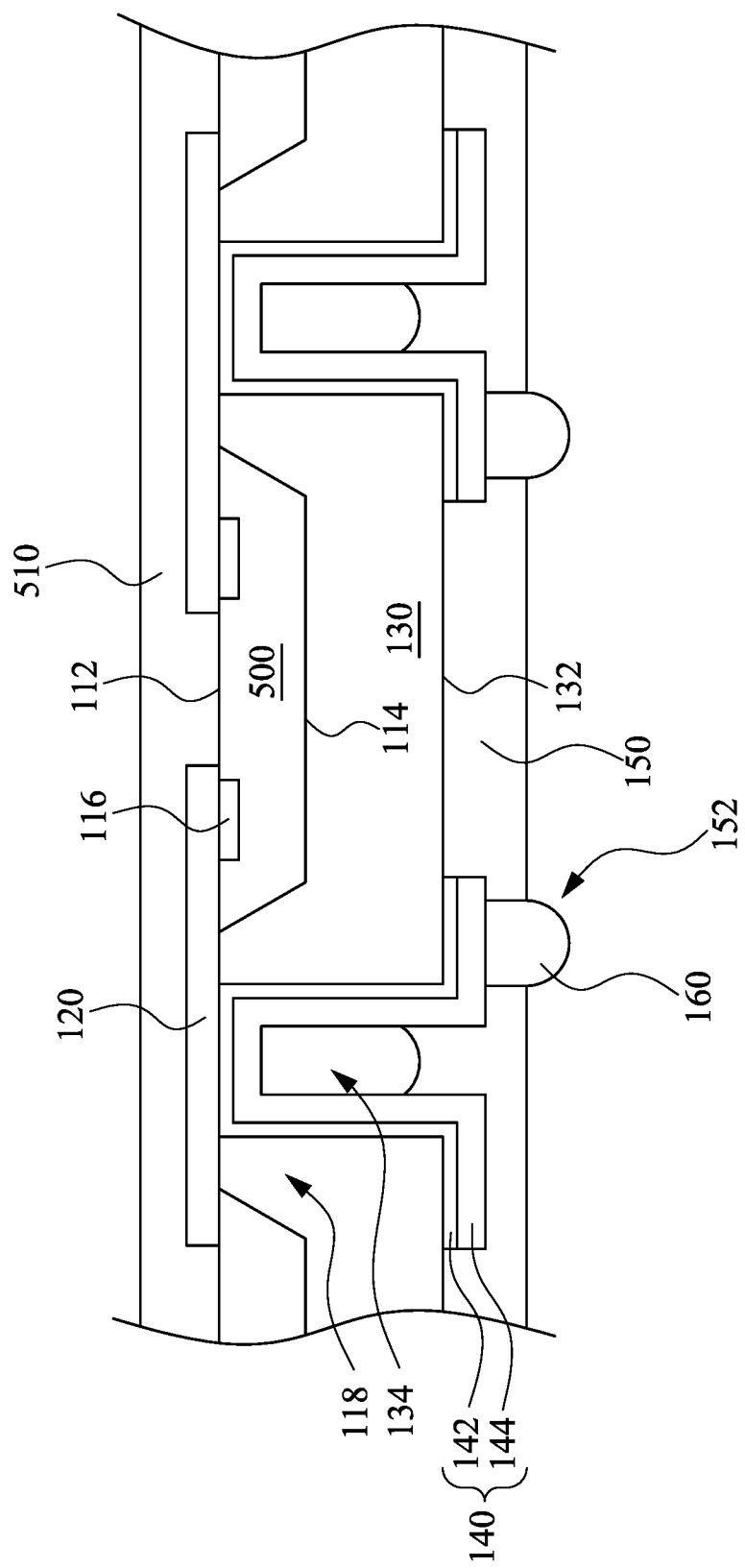

Continuing in step 470 and FIG. 5G, a passivation layer 150 is formed below the third surface 132 of the isolation layer 130 and below the conductive layer 140, and the passivation layer 150 is patterned to form an opening 152 exposing the conductive layer 140. Then, an external conductive connection 160 is formed in the opening 152. Insulating material is brush-coated to cover the third surface 132 of the isolation layer 130 and the conductive layer 140, so as to form the passivation layer 150, and the insulating material includes epoxy. In addition, a portion of the passivation layer 150 fills in, but not fully fills the second through hole 134. After that, the passivation layer 150 is patterned to form the opening 152, and a portion of the conductive layer 140 is exposed from the opening 152 of the passivation layer 150. Then, the external conductive connection 160 is formed in the opening 152. The external conductive connection 160 is electrically connected to the conductive pad 116 via the conductive layer 140 and the laser stop layer 120.

In some embodiments, the support body 510 above the first surface 112 of the wafer 500 is removed after forming the passivation layer 150. In some embodiments, the support body 510 on the first surface 112 of the wafer 500 is removed after forming the external conductive connection 160.

Figure 5H:
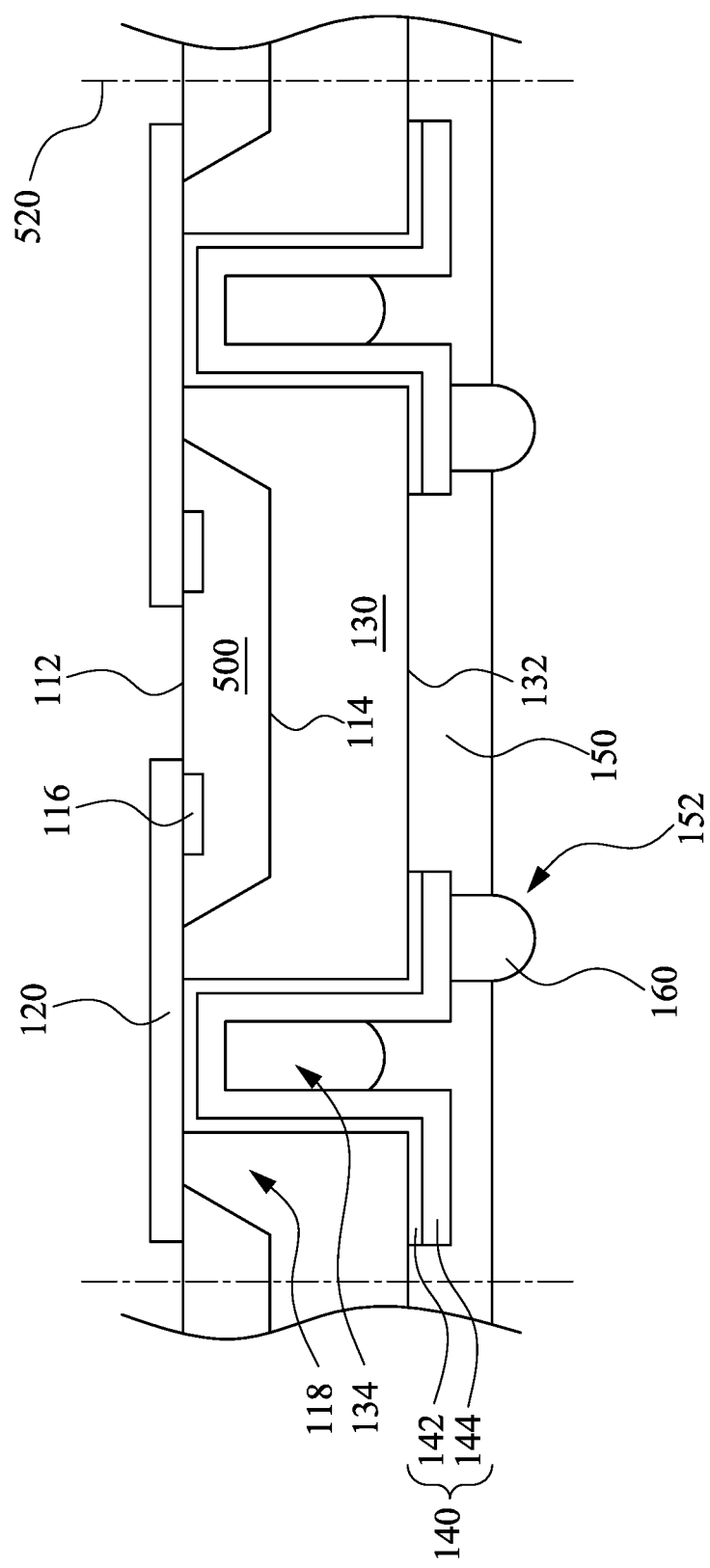

Continuing in step 480 and FIG. 5H, the wafer 500, the isolation layer 130 and the passivation layer 150 are diced along a scribe line 520 to form the chip package 100. The wafer 500 is diced alone the scribe line 520 to separate the chips on the wafer, so as to form the chip package 100 shown in FIG. 2.

The embodiments of the present disclosure discussed above have advantages over existing methods and structures, and the advantages are summarized below. The chip package and the fabrication method thereof omit the conventional processes of chemical vapor depositing the isolation layer and patterning the isolation layer. In addition, laser is applied to reduce a hole diameter of the through hole, which is benefit for miniaturization design, and further saves process time and machine costs. On the other hand, no additional process is applied to the first surface of the chip, which has excellent flatness to improve detecting accuracy of the chip package.

Although the present invention has been described in considerable detail with reference to certain embodiments thereof, other embodiments are possible. Therefore, the spirit and scope of the appended claims should not be limited to the description of the embodiments contained herein. Reference will now be made in detail to the embodiments of the invention, examples of which are illustrated in the accompanying drawings. Wherever possible, the same reference numbers are used in the drawings and the description to refer to the same or like parts.

What is claimed is:
1. A chip package, comprising:
 a chip having a conductive pad, a first surface and a second surface opposite to the first surface, and the conductive pad being below the first surface;
 a laser stop layer disposed above the first surface and covering the conductive pad;

a first through hole extending from the second surface to the first surface to expose the laser stop layer;

an isolation layer disposed below the second surface and filled up in the first through hole, and the isolation layer having a third surface opposite to the second surface;

a second through hole extending from the third surface to the first surface, and the second through hole through the first through hole to expose the laser stop layer; and a conductive layer disposed below the third surface and extending into the second through hole to contact the laser stop layer.

2. The chip package of claim 1, further comprising:

a passivation layer below the third surface and the conductive layer, and the passivation layer having an opening exposing the conductive layer; and an external conductive connection in the opening and in contact with the conductive layer.

3. The chip package of claim 1, wherein a hole diameter of the second through hole is less than a hole diameter of the first through hole.

4. The chip package of claim 1, wherein the conductive layer comprises a seed layer and a metal layer.

5. The chip package of claim 1, wherein a sidewall and a bottom of the second through hole are rough surfaces.

6. The chip package of claim 1, wherein the laser stop layer comprises copper.

7. The chip package of claim 1, wherein the laser stop layer has a thickness in a range from about 3 micrometers to 20 micrometers.

8. The chip package of claim 1, wherein the isolation layer comprises epoxy.

9. The chip package of claim 1, wherein a thickness of the conductive layer below the third surface of the isolation layer is greater than a thickness of the conductive layer on a sidewall of the second through hole.

10. The chip package of claim 1, wherein a thickness of the conductive layer on a sidewall of the second through hole is greater than a thickness of the conductive layer below the laser stop layer.

11. A method of fabricating a chip package, comprising:

providing a wafer, the wafer having a conductive pad, a first surface and a second surface opposite to the first surface, and the conductive pad being below the first surface;

forming a laser stop layer above the first surface to cover the conductive pad;

forming a support body above the first surface to cover the laser stop layer;

forming a first through hole extending from the second surface to the first surface to expose the laser stop layer;

forming an isolation layer below the second surface and filling the first through hole, and the isolation layer having a third surface opposite to the second surface;

using a laser to remove a portion of the isolation layer to form a second through hole, and the laser being through the first through hole and stopped at the laser stop layer; and forming a conductive layer below the third surface and below the laser stop layer exposed from the second through hole.

12. The method of fabricating the chip package of claim 11, further comprising:

forming a passivation layer below the third surface of the isolation layer and below the conductive layer; and patterning the passivation layer to form an opening exposing the conductive layer.

13. The method of fabricating the chip package of claim 12, further comprising forming an external conductive connection in the opening, and the external conductive connection being in contact with the conductive layer.

14. The method of fabricating the chip package of claim 13, further comprising:

removing the support body; and dicing the wafer, the isolation layer and the passivation layer along a scribe line to form the chip package.

15. The method of fabricating the chip package of claim 11, wherein the laser is aligned to the first through hole when using the laser to remove the portion of the first isolation layer.

16. The method of fabricating the chip package of claim 11, wherein forming the conductive layer comprises:

forming a seed layer below the third surface and in the second through hole; and forming a metal layer below the seed layer.

17. The method of fabricating the chip package of claim 11, wherein the laser stop layer is formed by electroplating.

18. The method of fabricating the chip package of claim 11, wherein the isolation layer is formed by printing or coating.

19. The method of fabricating the chip package of claim 11, further comprising:

polishing the second surface of the wafer after forming the support body above the first surface.

20. The method of fabricating the chip package of claim 11, further comprising:

coating, imprinting, molding or polishing the third surface of the isolation layer after forming the isolation layer below the second surface and filling the first through hole.

* * * * *